(12) United States Patent
Bird et al.

(10) Patent No.: US 10,027,344 B1
(45) Date of Patent: Jul. 17, 2018

(54) RESOLVER TO DIGITAL CONVERSION APPARATUS AND METHOD

(71) Applicant: RAYTHEON COMPANY, Waltham, MA (US)

(72) Inventors: Marcos Bird, McKinney, TX (US); Brian D. Pautler, The Colony, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/408,541

(22) Filed: Jan. 18, 2017

(51) Int. Cl.
*H03M 1/48* (2006.01)
*G01D 5/20* (2006.01)

(52) U.S. Cl.
CPC ............ *H03M 1/485* (2013.01); *G01D 5/204* (2013.01)

(58) Field of Classification Search
CPC ..................................................... H03M 1/485
USPC ................................. 341/110, 111, 116, 112
See application file for complete search history.

(56) References Cited

U.S. PATENT DOCUMENTS

| | | | | |
|---|---|---|---|---|
| 3,624,642 A * | 11/1971 | Tripp | ................... | H03M 1/485 318/569 |
| 4,989,001 A | 1/1991 | Serev | | |
| 5,347,277 A | 9/1994 | Nondahl et al. | | |
| 2002/0149335 A1* | 10/2002 | Imai | ....................... | H02P 6/185 318/494 |
| 2003/0172727 A1* | 9/2003 | Herb | ....................... | G01P 13/04 73/114.26 |
| 2008/0012522 A1* | 1/2008 | Wiegers | ................... | H02P 6/16 318/638 |
| 2016/0134213 A1* | 5/2016 | Jeong | .................. | G01D 5/2006 702/151 |

OTHER PUBLICATIONS

Szymczak et al., "Precision Resolver-to-Digital Converter Measures Angular Position and Velocity", Analog Dialogue, 48-03, Mar. 2014, pp. 1-6.
Kim et al., "Software Resolver-to-Digital Converter for Compensation of Amplitude Imbalances using D-Q Transformation", Journal of Electrical Engineering Technology, vol. 8, No. ?, 2013, pp. 789-798.
Hoseinnezhad et al., "A Novel Hybrid Angle Tracking Observer for Resolver to Digital Conversion", 44th IEEE Conference on Decision and Control, 2005, pp. 7020-7025.

* cited by examiner

*Primary Examiner* — Peguy Jean Pierre
(74) *Attorney, Agent, or Firm* — Lando & Anastasi, LLP

(57) ABSTRACT

A resolver to digital converter is provided and includes first and second inputs to receive signals from a resolver and an output to provide an estimated angle of a rotor. The sine component signal is multiplied by the cosine of the estimated angle and the cosine component signal is multiplied by the sine of the estimated angle, and a difference between them is calculated to provide an error measurement. The estimated angle is updated by the error measurement.

21 Claims, 5 Drawing Sheets

RESOLVER TO DIGITAL CONVERSION APPARATUS AND METHOD

GOVERNMENT LICENSE RIGHTS

This invention was made with Government support. The Government has certain rights in the invention.

BACKGROUND

Resolvers are electromechanical angle transducers that may be used for position and speed measurement within rotating equipment, such as motors, pumps, servos, vehicles, robotics, radar systems, and the like. Typically a primary electrical winding is mechanically coupled to the rotating equipment and is energized by an excitation signal. Two or more secondary windings are located near the primary winding with intersecting positions and/or orientations, and are electromagnetically coupled to the primary winding, as in a transformer. The coupling factor to each secondary winding is dependent upon the angular orientation of the primary winding, which changes as the primary winding rotates. Accordingly, the coupling factors to the secondary windings vary with the angular orientation of the primary winding. By monitoring and processing signals from the secondary windings, information may be determined about the angle, speed, and acceleration of the rotating equipment. It is often desirable to produce a digital indication of the angular information.

SUMMARY OF THE INVENTION

Aspects and embodiments are directed to resolver to digital converters that receive input signals from secondary windings of a resolver and provide a digital indication of the angular position of the resolver without the excitation signal available for a conventional demodulation. The indication of angular position may be achieved without a demodulation by, for example, determining zero-crossing points of the secondary winding signals to apply a sign (positive or negative) to a processed signal that is conventionally demodulated. Determination of whether to apply a positive or a negative value to the signal effectively eliminates the need to demodulate and thereby eliminates the need to have a reference excitation signal provided or internally regenerated.

According to one aspect, a resolver converter is provided that includes a first input to receive a first signal, the first signal representing a sine component of a rotor angle; a second input to receive a second signal, the second signal representing a cosine component of the rotor angle; an output to provide an estimated rotor angle; at least one multiplier configured to multiply the first signal by the cosine of the estimated rotor angle to produce a first multiplied signal and to multiply the second signal by the sine of the estimated rotor angle to produce a second multiplied signal; a subtractor configured to calculate a difference between the first and second multiplied signals, the difference being an error measurement; and a combiner configured to update the estimated rotor angle by combining the error measurement with the estimated rotor angle.

In various embodiments, the resolver converter may include an analog to digital converter configured to convert the first and second signals from an analog form to a digital form. In embodiments, the resolver converter may include a lookup table configured to provide the cosine of the estimated rotor angle and to provide the sine of the estimated rotor angle. The resolver converter may include a toggle element configured to selectively reverse the sign of the error measurement.

In embodiments, the combiner may be configured to update the estimated rotor angle by adding the error measurement after the error measurement is selectively multiplied by one of positive unity and negative unity. The error measurement may be selectively multiplied by the one of positive unity and negative unity based upon a current binary state of a sign indicator, and the sign indicator may toggle between two binary states, the toggle event being triggered by detection of a zero crossing in at least one of the first signal and the second signal.

According to another aspect, a method of converting resolver signals to an estimated rotor angle is provided and includes receiving a first signal from a resolver, the first signal representing a sine component of a rotor angle; receiving a second signal from the resolver, the second signal representing a cosine component of the rotor angle; multiplying the first signal by a cosine of the estimated rotor angle to provide a third signal; multiplying the second signal by a sine of the estimated rotor angle to provide a fourth signal; calculating an error measurement as a difference between the third and fourth signals; and modifying the estimated rotor angle by combining the error measurement with the estimated rotor angle.

In embodiments, the method includes converting the first and second signals from an analog form to a digital form. In embodiments, the method includes selecting the cosine of the estimated rotor angle and the sine of the estimated rotor angle from a lookup table. In embodiments, the method includes selectively reversing the sign of the error measurement.

In embodiments, combining the error measurement with the estimated rotor angle may include adding the error measurement after the error measurement is selectively multiplied by one of positive unity and negative unity. The error measurement may be selectively multiplied by the one of positive unity and negative unity based upon a current binary state of a sign indicator. The sign indicator may be toggled between two binary states, the toggling triggered by detection of a zero crossing in at least one of the first signal and the second signal.

According to another aspect, a non-transitory computer readable medium having stored instructions is provided, and the instructions, when executed by a processor coupled to a resolver, cause the processor to perform a method including receiving a first signal from the resolver, the first signal representing a sine component of a rotor angle; receiving a second signal from the resolver, the second signal representing a cosine component of the rotor angle; multiplying the first signal by a cosine of the estimated rotor angle to provide a third signal; multiplying the second signal by a sine of the estimated rotor angle to provide a fourth signal; calculating an error measurement as a difference between the third and fourth signals; and modifying the estimated rotor angle by combining the error measurement with the estimated rotor angle.

In embodiments, the medium may include instructions for converting the first and second signals from an analog form to a digital form. In embodiments, the medium may include instructions for selecting the cosine of the estimated rotor angle and the sine of the estimated rotor angle from a lookup table. The medium may include instructions for selectively reversing the sign of the error measurement.

In embodiments, combining the error measurement with the estimated rotor angle includes adding the error measurement after the error measurement is selectively multiplied by one of positive unity and negative unity. The error measurement may be selectively multiplied by the one of positive unity and negative unity based upon the current binary state of a sign indicator. The sign indicator may be toggled between two binary states, the toggling triggered by detection of a zero crossing in at least one of the first signal and the second signal.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to resolver to digital converters that receive input signals from secondary windings of a resolver and provide a digital indication of the angular position of the resolver without performing a conventional demodulation. Accordingly, the resolver to digital converters disclosed herein do not need to be provided with the excitation signal, which may be unavailable, nor is it necessary to internally recover or generate a synthesized reproduction of the excitation signal, which saves complexity and expense in design and production.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
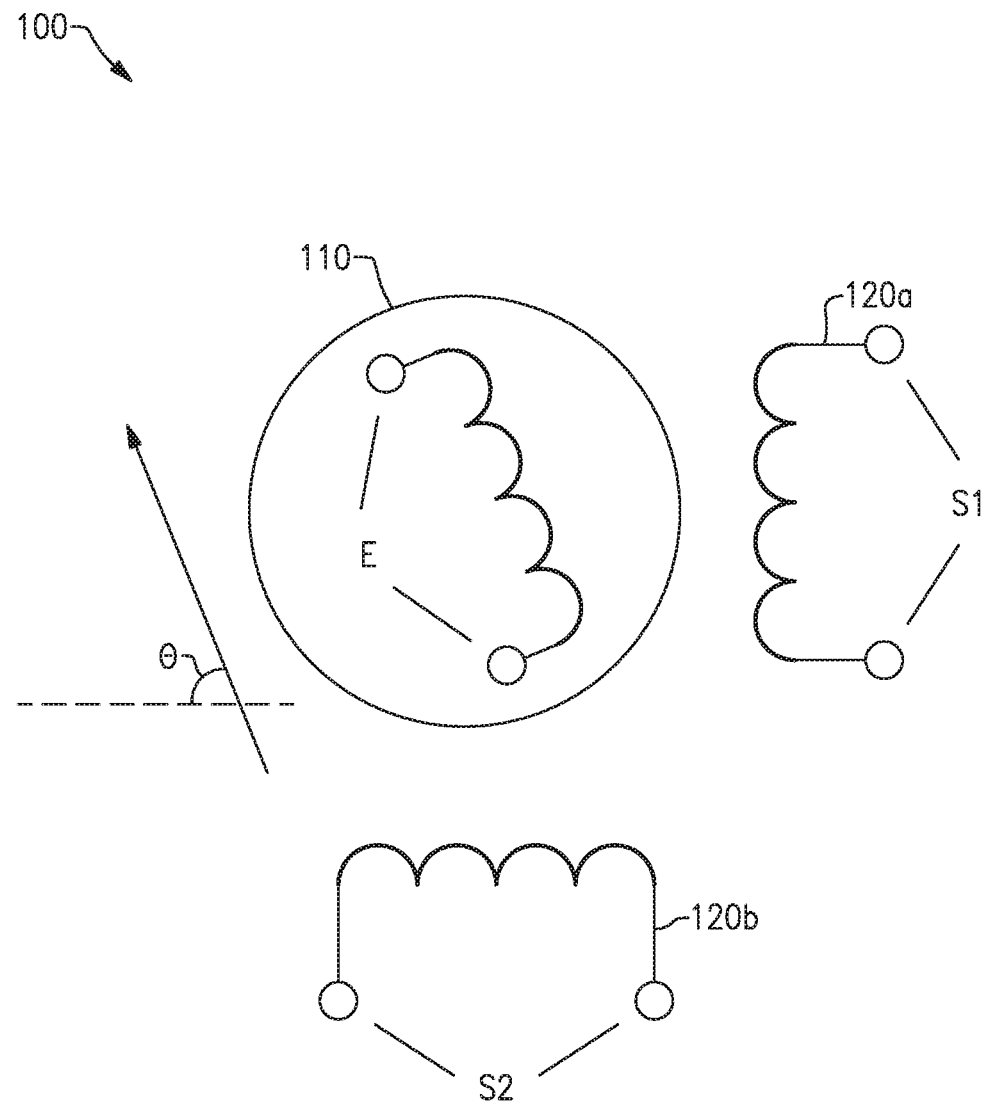
FIG. 1 is a schematic diagram of a resolver.

FIG. 1 is a schematic diagram of an example of a resolver 100. The example resolver 100 is an electromechanical device that includes a primary winding 110 and two secondary windings 120a, 120b. The two secondary windings 120a, 120b are positioned at a right angle to each other, generally having axes perpendicular to and intersecting one another. The primary winding 110 is disposed on a rotor and allowed to rotate, and is typically placed in mechanical connection with rotating equipment to be measured/monitored. The secondary windings 120a, 120b are typically disposed on a stator and do not rotate with the rotating equipment. The two secondary windings 120a, 120b, at right angles to one another and in proximity to the primary winding 110, operate as a pair of variable coupling transformers, with the amount of electromagnetic coupling between the primary winding 110 and each of the two secondary windings 120a, 120b, varying according to the position of the rotor.

When the primary winding 110 is driven by an excitation signal, for example a sinusoidal signal, secondary signals are induced in the two secondary windings 120a, 120b. The amount of coupling is dependent upon the angular position of the rotor relative to the stator, resulting in the generation of two signals (one from each of the two secondary windings 120a, 120b) whose relative amplitude and phase relationship are indicative of the angular position of the rotor.

Other examples of resolvers may include more or different secondary windings or may be in different orientations. In other embodiments, the primary and secondary windings may all be on the stator (or rotor), and the variation in coupling may be achieved through variable reluctance created by the rotor (or stator). In various embodiments, alternate resolvers may be the source of the signals processed to generate angular position information.

With continuing reference to FIG. 1, a sinusoidal excitation signal (E) may be provided to the primary winding 110 having an excitation frequency $f=\omega/2\pi$, where f is the frequency (typically in cycles/sec, or Hertz, Hz) and w is the angular frequency (typically in radians/sec, rad/sec). It should be noted the angular frequency of the excitation signal is independent and distinct from the angular rotation rate of the rotor, which may also be expressed in rad/sec. The former is the frequency of the excitation signal driving the primary winding 110 whereas the latter is the mechanical rotation rate of the rotor. The excitation frequency is typically chosen to be much higher than the maximum expected rotation rate of the rotor, such that the excitation signal will provide multiple signal cycles during any full rotation of the rotor, even when the rotor is spinning at its maximum speed. The excitation signal may be mathematically described as $E=A_0 \sin(\omega t)$, where $A_0$ is the amplitude of the excitation signal and t is time.

Angular position of the rotor is presented with reference to the angle of the main axis of the primary winding 110 relative to the axis of one of the secondary windings, e.g., secondary winding 120b, as annotated by the symbol θ in FIG. 1.

A secondary signal will be induced in each of the secondary windings 120a, 120b, based upon the excitation signal in the primary winding 110 and a coupling factor that depends upon the rotor angle, θ. For example, when θ=90° coupling between the primary winding 110 and the first secondary winding 120a will be at a maximum, and coupling between the primary winding 110 and the second secondary winding 120b will be at a minimum. As the rotor rotates, i.e., for any angular position of rotor angle θ, the induced signal in the first secondary winding 120a will vary in amplitude as the sin(θ), and the induced signal in the second secondary winding 120b will vary in amplitude as the cos(θ). Mathematically, the two secondary windings 120a, 120b, will generate induced signals, respectively, as follows:

$$S1 = A_1 \sin(wt)\sin(\theta) \quad (1)$$

$$S2 = A_1 \sin(wt)\cos(\theta) \quad (2)$$

where $A_1$ is the amplitude of the induced signals and is related to $A_0$ by a transformation ratio, i.e., the maximum coupling factor when the primary winding 110 is axially aligned with either of the secondary windings 120a, 120b. Note that the S1 signal is a variant of the excitation signal factored by the sine of the rotor angle θ and the S2 signal is a variant of the excitation signal factored by the cosine of the rotor angle θ. Accordingly, the S1 and S2 signals contain information regarding the rotor angle θ and the S1 and S2 signals may be referred to as the SIN and COS signals, respectively.

In accord with the above description, a resolver is an electromechanical sensor, or transducer, that when driven with an excitation signal produces induced signals (e.g., SIN, COS) dependent upon relative angular position, θ, of a rotor. The SIN and COS signals need to be processed to provide a useful output of angular information, such as the angle θ, rotation rate, or acceleration, for example. Angular information is often desired to be in a digital format. Circuitry and/or logic that generates digital angular information according to signals received from a resolver is called a Resolver-to-Digital Converter (RDC).

Figure 2:
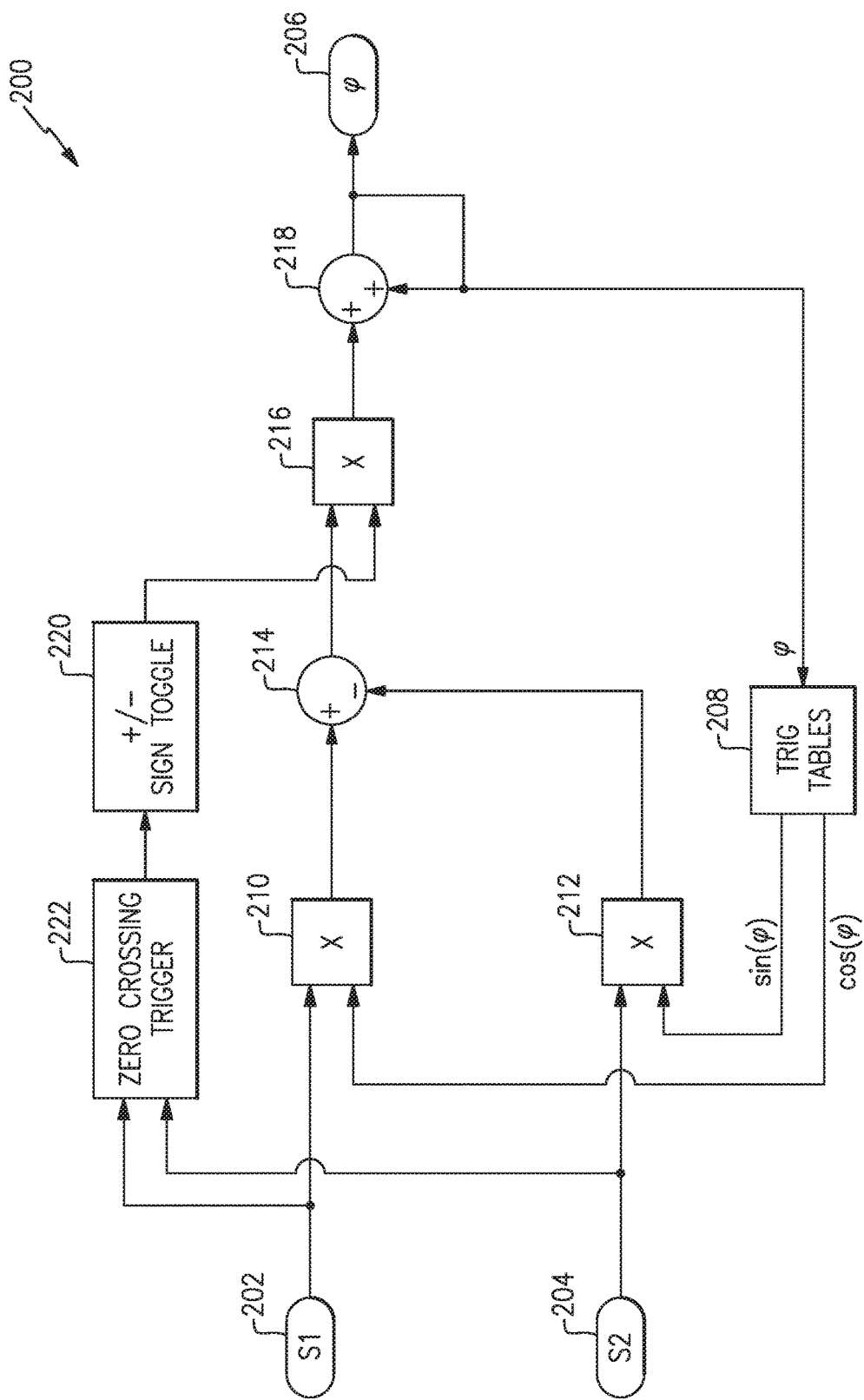
FIG. 2 is a schematic diagram of one example of a resolver to digital converter in accord with aspects of the invention.

FIG. 2 is a block diagram of an example of an RDC 200 in accord with certain embodiments. The RDC 200 of FIG. 2 includes a first input 202 to receive the SIN (i.e., S1) signal from, e.g., the first secondary winding 120a, a second input 204 to receive the COS (i.e., S2) signal from, e.g., the second secondary winding 120b, and an output 206 to provide a signal that indicates an estimated rotor angle, φ, based upon the SIN and COS signals.

According to one embodiment, operation of the RDC 200 occurs by making incremental adjustments to the estimated rotor angle, φ, so that its value approaches the actual rotor angle, θ. At any given time, the output 206 indicates some estimated rotor angle, φ. The estimated rotor angle φ is fed into a lookup table 208 that provides trigonometric values of the cosine and sine of the estimated rotor angle φ. The trigonometric values are multiplied by the SIN and COS signals, respectively, at a first multiplier 210 and a second multiplier 212, respectively. Accordingly, the S1 signal, which is the SIN signal, is multiplied by cos(φ) and the S2 signal, which is the COS signal, is multiplied by sin(φ). The mathematical representation of the output signals of the first multiplier 210 and the second multiplier 212 are, respectively:

$$A_1 \sin(\omega t)\sin(\theta)\cos(\varphi) \quad (3)$$

$$A_1 \sin(\omega t)\cos(\theta)\sin(\varphi) \quad (4)$$

It should be noted that if the estimated rotor angle φ is equal to the actual rotor angle θ, expressions (3) and (4) are equal. If the estimated rotor angle φ is not equal to the actual rotor angle θ, the difference between expressions (3) and (4) indicates an amount by which the estimate should be changed. A subtractor 214 calculates the difference between expressions (3) and (4), and the result is an error measurement. The error measurement is an indication of the amount by which the estimated rotor angle φ should be adjusted to approach the actual rotor angle θ. At this point, the error measurement, which is the output of the subtractor 214, may either need to be added to the existing estimated rotor angle φ or be subtracted from the existing estimated rotor angle φ. Accordingly, a third multiplier 216 multiplies the error signal by a value that is either +1 or −1, and thereby affects whether a feedback adder 218 adds or subtracts the error measurement from the existing estimated rotor angle φ to generate a new estimated rotor angle φ closer in value to the actual rotor angle θ. Through iterations, the estimated rotor angle φ will adjust in value to move closer to the actual rotor angle θ value until the two values match, i.e., φ=θ, at which point the output 206 indicates the actual rotor angle θ.

The value +1 or −1 provided as an input to the third multiplier 216, which determines whether the error measurement is added or subtracted from the existing estimated rotor angle φ, is determined by a toggle circuit 220. The toggle circuit 220 toggles between the output values of +1 and −1, and, according to certain embodiments, the toggle is driven, or triggered, by zero crossings in the SIN and COS signals. The trigger is provided by a zero crossing detector 222, discussed in further detail below.

As will be appreciated by those skilled in the art, the example RDC 200 has been described without regard to whether the schematic diagram shown in FIG. 2 is implemented in digital or analog form. In certain embodiments, the RDC 200 may operate in the analog domain and the output 206 may be an analog signal fed to an Analog-to-Digital Converter (ADC) that ultimately yields a digital indication of rotor angle θ. Alternatively, the RDC 200 may be implemented as a digital circuit whereby the input SIN and COS signals are processed by one or more ADC's to be in digital form at the inputs 202, 204. Convergence of the output 206 may be affected by various time constants of the circuitry when implemented in analog form and by clock rate when implemented digitally. While certain embodiments may include either form of RDC 200, the discussion below presumes that the SIN and COS signals have been digitized by one or more ADC's and the circuitry of FIG. 2 is implemented in digital form. A digital form RDC 200 may be implemented in hardware logic, software logic, or any combination thereof. In at least one embodiment, the RDC 200 is implemented as executable instructions stored on a computer readable medium and executed on one or more processors.

As discussed above, the frequency of the excitation signal applied to the resolver may be much higher than the maximum mechanical rotational frequency that the rotor is expected to experience. In this way, each of SIN and COS will provide multiple induced signal cycles at the excitation frequency over small changes in the rotor angle θ, even for high rotation rates where the rotor angle θ may be changing rapidly with time. Note from expressions (3) and (4) above that the excitation frequency remains in the SIN and COS signals, thus a typical sampling rate to digitize the SIN and COS signals will be at least double the excitation frequency, according to the Nyquist criterion, and in some embodiments may be significantly higher. As a result, an operational clock frequency, at the sampling rate, processes multiple samples of the SIN and COS signals for each cycle of the excitation signal, and therefore, also for small changes in rotor angle θ even when the rotor is spinning at an expected maximum rate, i.e., even when the rotor angle θ is changing rapidly. Accordingly, the RDC 200, clocked at a high enough sampling rate, is able to precisely track the rotor angle θ according to varying operational needs and design criteria. In various embodiments, sampling rates, resolutions, and switching speeds of the components of RDC 200 may be varied to meet varying specifications and application needs.

Figure 3:
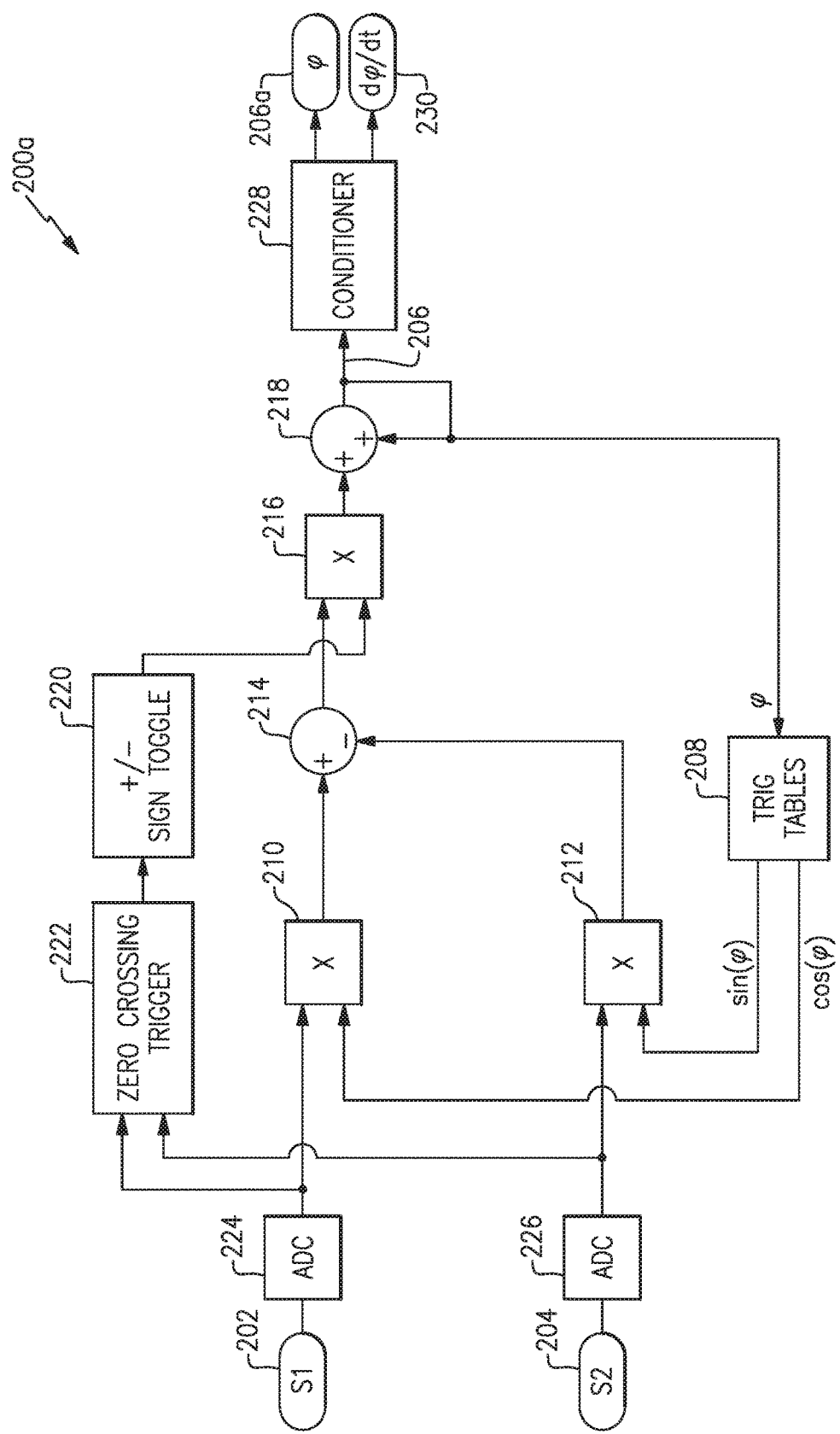
FIG. 3 is a schematic diagram of another example of a resolver to digital converter in accord with aspects of the invention.

FIG. 3 illustrates another example of an RDC 200a having similar components as the RDC 200 but including analog-to-digital converters (ADC's) 224, 226 that digitize the SIN and COS signals received at inputs 202, 204, respectively. In the RDC 200a of FIG. 3, the inputs 202, 204 are analog inputs receiving the induced SIN and COS signals from the secondary windings 120a, 120b, respectively. Once the SIN and COS signals are digitized, the remainder of the RDC 200a shown in FIG. 3 may be implemented in hardware logic, software logic, or any combination thereof, as noted above.

According to one embodiment, the RDC 200a of FIG. 3 includes a conditioner 228 that receives the output 206 from the adder 218 and provides a conditioned output 206a that is a low-pass filtered version of the output 206 discussed above. The conditioned output 206a indicates the estimated rotor angle φ, and by extension the actual rotor angle θ as discussed above, stripped of high frequency variations. The result is that the output 206a does not indicate variations produced by high frequency components or products of the excitation signal, such as, for example, impulse responses or convergence times or residuals of the excitation signal. Applying the conditioner 228 produces an output 206a that is smoother than the output 206. In one embodiment, the conditioner 228 may be implemented as a hold circuit that requires any change in the estimated rotor angle φ to be maintained for a certain number of sample times before allowing the change to be reflected at the output 206a. The output 206a provides beneficial smoothing of the estimated rotor angle φ, avoiding sudden jumps or changes in the output that may be erroneous or may be problematic to further processing circuitry. The number of sample times may be varied to accommodate changing operational needs and applications. In other embodiments, the conditioner 228 may incorporate a weighted average of prior values, or may be any other implementation suitable to smooth the output 206a.

The conditioner 228 of the RDC 200a may also provide a time-derivative output 230 that indicates the rate at which the estimated rotor angle φ, and by extension the actual rotor angle θ, is changing. A time-derivative rate of change of the rotor angle θ is a measure of rotor's mechanical angular movement per unit time and may be indicated, for example, in units of radians per second, degrees per second, rotations per minute, or the like. In at least one embodiment, the derivative function of the conditioner 228 may be implemented as logic that subtracts, from a current estimated rotor angle φ, the estimated rotor angle φ from the previous unit of time. In other embodiments, the derivative may involve a running average that factors in additional time units or any time window, or a weighted average that factors in a decaying influence of past estimated rotor angles φ. In other embodiments, the time derivative may be implemented differently, as will be appreciated by those skilled in the art, given the benefit of this disclosure.

As discussed above, the RDC 200 or 200a may include a zero crossing detector 222. The zero crossing detector 222 triggers the toggle circuit 220 to selectively cause the error measurement to be added or subtracted from the estimated rotor angle φ. The zero crossing detector 222 receives as inputs the sampled SIN and COS signals, as illustrated in FIG. 3. Given the physical architecture of the resolver, the SIN and COS signals are substantially in-phase or substantially 180° out-of-phase with each other, depending upon which quadrant the rotor is in. For example, in one quadrant of the rotor, both the SIN and COS signals will be essentially in phase with the excitation signal. The phase of each secondary winding 120a, 120b will reverse as the primary winding 110 passes through a perpendicular orientation with respect to each secondary winding 120a, 120b. Thus, beginning in a quadrant where the SIN and COS signals are essentially in phase with the excitation signal, the primary winding 110 will pass through a perpendicular orientation with one of the secondary windings 120, causing either the SIN signal or the COS signal to reverse phase as the rotor enters the next quadrant. As the rotor continues around, the primary winding 110 will approach a perpendicular orientation with the other secondary winding 120, causing the other of the SIN or COS signal to reverse phase. In this manner, the SIN and COS signals continuously alternate between being substantially in-phase and out-of-phase with each other as the rotor passes from one quadrant to the next. For a high excitation frequency relative to the rotational rate of the rotor, the SIN and COS signals produce multiple cycles (at the excitation frequency) over relatively small changes in rotor angle θ. With each cycle of the excitation signal, the SIN and COS signals alternate twice, e.g., they each change from positive to negative, relative to a zero DC offset, and back again from negative to positive, during each cycle. When the SIN and COS signals change sign, the error measurement as calculated by the subtractor 214 also changes sign.

As discussed above, the difference calculated by the subtractor 214 is an error measurement that changes sign due to the alternating cycles, even when the error is not changing. To correct for this, the toggle circuit 220 applies alternating +1 and −1 values to the error measurement via the third multiplier 216 before the error measurement is added to estimated rotor angle φ by the adder 218. The result is to selectively add or subtract the error measurement to correct for, and thereby remove, the cycle-based sign change in the error measurement occurring at twice the excitation frequency. Note this "erroneous" sign change in the error measurement occurs when the SIN and COS signals pass through their mid-point values, changing from positive to negative, or vice versa, also known as their zero-crossing points.

Use of the term "zero-crossing points" does not necessarily mean the instant a signal has a zero voltage level. Rather, the term is intended to refer to instances where the SIN or COS signals change "polarity." In certain examples, such as were the SIN and COS signals to be ideal signals with no DC bias or offset, the the SIN and COS signals literally cross through a zero voltage level. However, in other examples, at least because the SIN and COS signals may be digitized, as in the RDC 200a of FIG. 3, the ADC's may add a DC offset and therefore the digital values may not literally indicate zero volts when the alternating analog signal changes polarity, i.e., crosses through zero. Accordingly, the "zero-crossing points" may be determined by methods other than detecting a literal zero voltage or digital value of zero.

For example, and in at least one embodiment, the zero-crossing point of a sinusoidal signal occurs at the points in the waveform that have the highest slope, positive or negative, i.e., where the signal is changing the most rapidly in either an increasing or a decreasing direction. Accordingly, in at least one embodiment, the zero crossing detector 222 takes the derivative of the SIN and COS signals and identifies the zero-crossing points as those points where SIN and COS are changing the most rapidly, whether increasing or decreasing. In other embodiments, the zero crossing detector 222 may detect the zero-crossing points using other methods.

In another example, it is recognized that the SIN and COS signals are equal to each other at the zero-crossing points, because they are either in-phase or 180° out-of-phase with each other at each point in time. Thus certain embodiments may implement a zero crossing detector 222 that identifies points in time when SIN is equal to COS, which may indicate that a zero-crossing is occurring at those points.

The zero crossing detector 222 triggers the toggle circuit to change the sign, i.e., the +1 or −1 value, applied to the error measurement by the third multiplier 216 when the zero crossing detector 222 identifies a zero-crossing point. Alternatively stated, the zero crossing trigger causes the toggle circuit 220 in conjunction with the third multiplier 216 and the adder 218 to selectively add or subtract the error measurement from the estimated rotor angle φ.

In some embodiments, the zero crossing detector 222 may include a threshold element that requires either the SIN signal or the COS signal to exceed a threshold amplitude before using the respective SIN or COS signal for determination of a zero-crossing point. This is beneficial because when the primary winding 110 is at a right angle to one of the two secondary windings 120a, 120b, i.e., when the rotor angle θ is one of 0°, 90°, 180°, or 270°, one of the two secondary windings 120a, 120b, will briefly have zero amplitude because the coupling factor between two windings at right angles to each other is zero (at least in theory, with ideal windings and ideal mechanical alignment). Accordingly, it may be unreliable to detect a zero-crossing point based upon the derivative of a SIN or COS signal with a low amplitude. However, whenever one of the secondary windings 120a, 120b is perpendicular to the primary winding 110, the other of the secondary windings 120a, 120b will be axially aligned with the primary winding 110. The result is that when the SIN signal amplitude is at a minimum (θ=0° or 180°; sin(θ)=0), the COS signal amplitude will be at a maximum (cos(θ)=1). Likewise, when the COS signal is at a minimum (θ=90° or 270°; cos(θ)=0), the SIN signal amplitude will be at a maximum (sin(θ)=1). By applying a threshold to the SIN and COS signal amplitudes, in embodiments the zero crossing detector 222 may alternately use whichever of the SIN or COS signals has a higher amplitude, and therefore higher reliability, for identifying zero-crossing points.

According to certain embodiments, the RDC 200 and RDC 200a advantageously operate without down-converting or demodulating the SIN or COS signals. The excitation signal remains as a fundamental carrier frequency in the SIN and COS signals as they are processed by the RDC 200 or RDC 200a. In certain examples the excitation frequency may be present at the output 206, and may only be finally removed by the conditioner 228. Because the RDC's 200, 200a do not rely on demodulation, there is no need to recover or otherwise have the excitation signal available.

Figure 4:
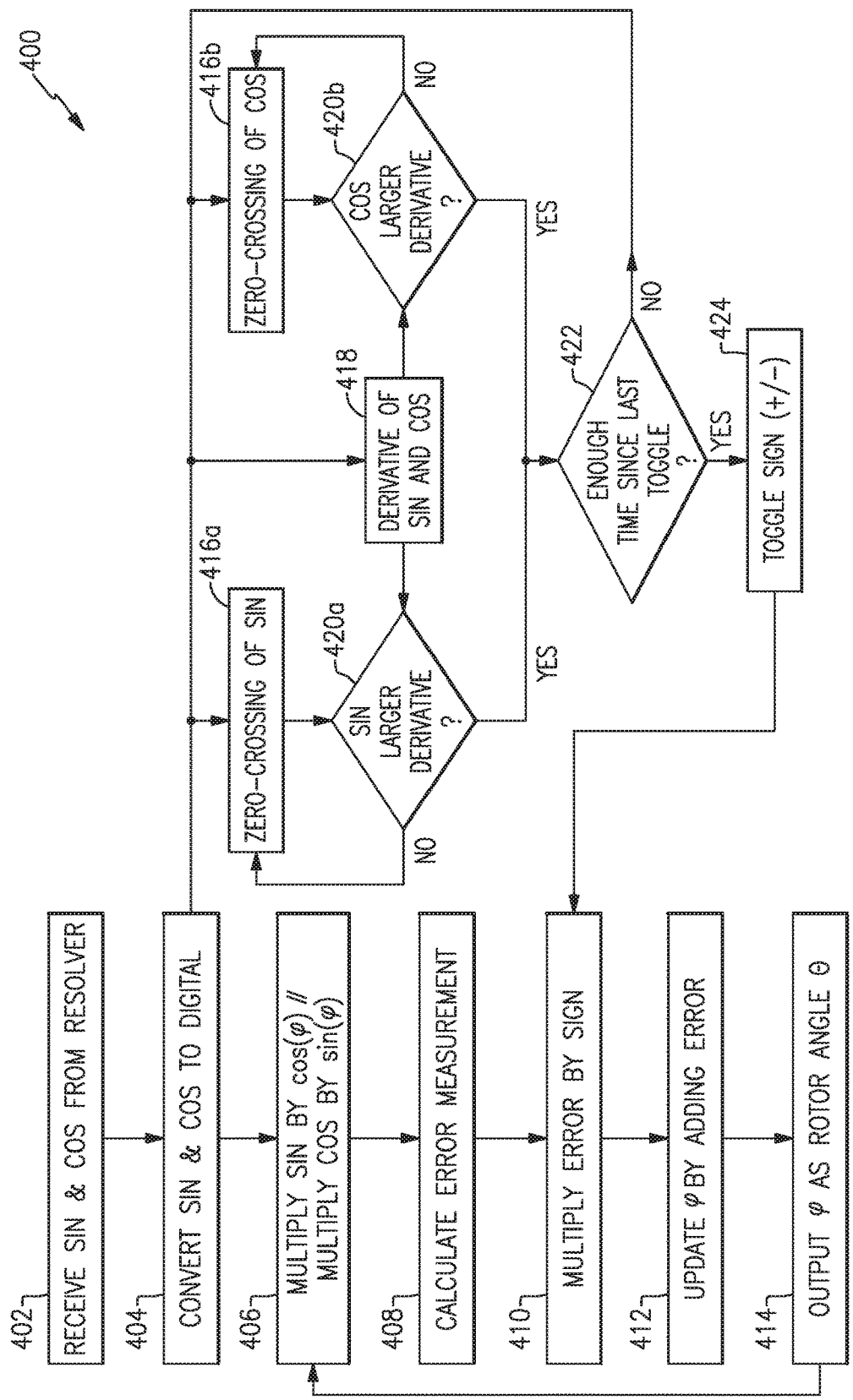
FIG. 4 is a flow diagram of one example of a method of converting resolver signals into digital angular information in accord with at least one aspect of the invention.

Turning to FIG. 4, a method 400 of converting resolver winding signals into digital angular information is presented. The method of FIG. 4 may be implemented by at least the RDC 200a as described above, and portions of the method may be implemented in hardware-based logic, software-based logic, or any combination thereof, as will be understood by those of skill in the art with the benefit of this disclosure. Referring to FIG. 4, and with further reference to FIGS. 2 and 3, according to one embodiment, the method 400 includes receiving SIN and COS signals from resolver windings (step 402) at, for example, the inputs 202 and 204, where the SIN and COS signals correspond to the analog induced signals from the first secondary winding 120a and the second secondary winding 120b, respectively. The SIN and COS signals are digitized (at step 404) by, for example, the ADC's 224 and 226. The SIN signal is multiplied by the cosine of an estimated angle φ and the COS signal is multiplied by the sine of the estimated angle φ (step 406) by, for example, the first multiplier 210 and the second multiplier 212, utilizing trigonometric values provided by, for example, the lookup table 208. An error measurement is calculated (step 408) by, for example, the subtractor 214, as the difference between the multiplied COS signal from the multiplied SIN signal. The error measurement is multiplied by a SIGN value, i.e., +1 or −1 (step 410) by, for example, the third multiplier 216, and added to the estimated angle φ to generate a new estimated angle φ (step 412) by, for example, the adder 218. The estimated angle φ is output as the rotor angle θ (step 414) at, for example, the output 206, and used in the next calculation of sine and cosine values in step 406. The +1 or −1 value of SIGN (used at step 410) is updated at intervals by monitoring for zero-crossings of SIN and COS (at steps 416). When a zero-crossing occurs, the derivative (step 418) of SIN and COS are compared (at steps 420) and if the zero-crossing occurred in the signal having the largest derivative, the value of SIGN is toggled (step 424). A threshold of time (step 422) since the last toggle may also be applied. Each of the steps 416 through 422 may be performed, for example, by the zero crossing detector 222. When a zero-crossing point is identified, the value of SIGN is toggled from +1 to −1 or vice versa (step 424) by, for example, the toggle circuit 220.

Various aspects and functions described herein may be implemented as specialized hardware or software components executing in one or more computer systems. There are many examples of computer systems that are currently in use. These examples include, among others, network appliances, personal computers, workstations, mainframes, networked clients, servers, and the like. Other examples of computer systems may include mobile computing devices (e.g., smart phones, tablet computers, laptop computers, and personal digital assistants). Examples of particular models of mobile computing devices include iPhones, iPads, and iPod touches running iOS operating system available from Apple, Android devices like Samsung Galaxy Series, LG Nexus, and Motorola Droid and X series, Blackberry devices available from Blackberry Limited, Windows phone devices, and the like. Further, aspects may be located on a single computer system or may be distributed among a plurality of computer systems connected to one or more communications networks.

For example, various aspects, functions, and processes may be distributed among one or more computer systems configured to provide information to one or more systems, or to provide a service to one or more client computers, or to perform an overall task as part of a distributed system. Additionally, aspects may be performed on a client-server or multi-tier system that includes components distributed among one or more server systems that perform various functions. Consequently, embodiments are not limited to executing on any particular system or group of systems. Further, aspects, functions, and processes may be implemented in software, hardware or firmware, or any combination thereof. Thus, aspects, functions, and processes may be implemented within methods, acts, systems, system elements and components using a variety of hardware and software configurations, and examples are not limited to any particular centralized or distributed architecture, network, or communication protocol.

Figure 5:
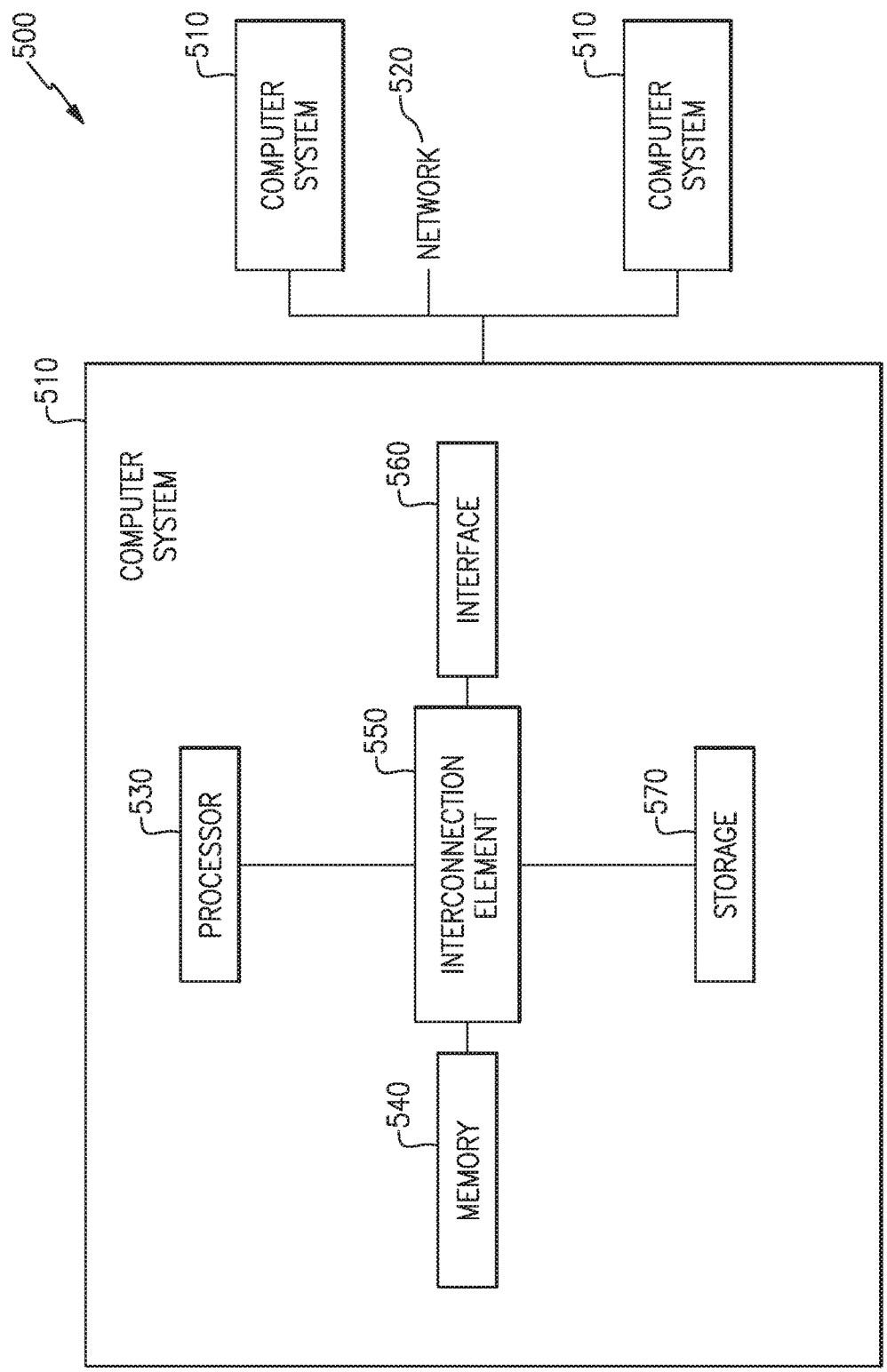
FIG. 5 is a block diagram of one example of a computer system suitable for implementing resolver to digital converters in accord with aspects of the invention.

Referring to FIG. 5, there is illustrated a block diagram of a distributed computer system 500 including one or more computers 510, in which various aspects and functions may be practiced. Any of the processing performed by any of the various components of the RDC 200 or the RDC 200a, and any of the steps of the method 400, may be implemented by one of the computers 510 shown in FIG. 5, for example, or by a similar computer or a distributed computer system, such as distributed computer system 500 or similar.

As illustrated in FIG. 5, at least one computer 510 includes a processor 530, a memory 540, an interconnection element 550, an interface 560 and data storage 570. To implement at least some of the aspects, functions, and processes disclosed herein, the processor 530 performs a series of instructions that result in manipulated data. For example, the processor 530 may execute instructions that cause any one or more of the steps of the method 400 of FIG. 4 to be performed, for instance, by direct manipulation of information by the processor 530, or by controlling additional hardware, such as one or more of the ADC's 224 or 226 of FIG. 3, for example. The processor 530 may be any type of processor, multiprocessor, or controller. Example processors may include a commercially available processor such as an Intel Xeon, Itanium, Core, Celeron, or Pentium processor; an AMD Opteron processor; an Apple A4 or A5 processor; a Sun UltraSPARC processor; an IBM Power5+ processor; an IBM mainframe chip; and the like; or a quantum computer. The processor 530 is connected to other system components, including one or more memory 540 devices, by the interconnection element 550.

The memory 540 stores programs (e.g., sequences of instructions coded to be executable by the processor 530) and data during operation of the computer 510. Thus, the memory 540 may be a relatively high performance, volatile, random access memory such as a dynamic random access memory ("DRAM") or static memory ("SRAM"). However, the memory 540 may include any device for storing data, such as a disk drive or other nonvolatile storage device. Various examples may organize the memory 540 into particularized and, in some cases, unique structures to perform the functions disclosed herein. These data structures may be sized and organized to store values for particular data and types of data.

Components of the computer 510 are coupled by an interconnection element 550. The interconnection element 550 may include any communication coupling between system components such as one or more physical busses in conformance with specialized or standard computing bus technologies such as IDE, SCSI, PCI and InfiniBand. The interconnection element 550 enables communications, including instructions and data, to be exchanged between system components of the computer 510.

The computer 510 also includes one or more interfaces 560 to accommodate devices such as input devices, output devices and combination input/output devices. Interface devices may receive input or provide output. More particularly, input devices may accept information from external sources and output devices may render information for external presentation. For example, an input device may receive an analog or digital signal input, such as inputs 202 and 204 of FIGS. 2 and 3, for example. Another example of input devices may include the ADC's 224 and 226 of FIG. 3. An output device may include, for example, the output 206 of FIGS. 2 and 3 that provides a value of the estimated rotor angle φ, or the outputs 206a and 230 of FIG. 3 that provide smoothed and rate-of-change values of the estimated rotor angle φ, respectively. These values may be output, for example, as a signal level or digital form for communication to one or more other computing systems. Additional examples of output devices may include monitors or displays that may render the values to be read by a user, or provide graphical displays to be used and/or interpreted by a user. Additional examples of interface devices include keyboards, mouse devices, trackballs, microphones, touch screens, printing devices, display screens, speakers, network interface cards, etc. Interface 560 allows the computer 510 to exchange information and to communicate with external entities, such as the resolver 100, users, and other systems.

The data storage 570 includes a computer readable and writeable nonvolatile, non-transitory, data storage medium in which instructions are stored that define a program or other object that may be executed by the processor 530. The data storage 570 also may include information that is recorded, on or in, the medium, and that is processed by the processor 530 during execution of the program. More specifically, the information may be stored in one or more data structures specifically configured to conserve storage space or increase data exchange performance. The instructions may be persistently stored as encoded signals, and the instructions may cause the processor 530 to perform any of the functions described herein. The medium may, for example, be optical disk, magnetic disk or flash memory, among others. In operation, the processor 530 or some other controller may cause recorded instructions or data to be read from the storage 570 into another memory 540, such as the memory 540, which allows for faster access to the information by the processor 530 than does the storage 570. A variety of components may manage data movement between the storage 570 and other memory 540 and examples are not limited to particular data management components. Further, examples are not limited to a particular memory 540 system or data storage 570 system.

Although the computer 510 is shown by way of example as one type of computer 510 upon which various aspects and functions may be practiced, aspects and functions are not limited to being implemented on any of the computers 510 as shown in FIG. 5. Various aspects and functions may be practiced on one or more computers having different architectures or components than those shown in FIG. 5. For instance, the computer 510 may include function-specific hardware, such as ADC's 224 and 226, for instance, and/or may include specially programmed, special-purpose hardware, such as an application-specific integrated circuit ("ASIC") tailored to perform a particular operation disclosed herein. For example, an ASIC may provide the hardware of one or more of the components of RDC's 200 or 200a shown in FIGS. 2 and 3, and may perform one or more of the steps of the method 400 of FIG. 4.

The computer 510 may include an operating system that manages at least a portion of the hardware elements included in the computer 510. In some examples, a processor or controller, such as the processor 530, executes an operating system. Examples of a particular operating system that may be executed include a Windows-based operating system, such as, Windows NT, Windows 2000 (Windows ME), Windows XP, Windows Vista, Windows Phone, or Windows 7 operating systems, available from the Microsoft Corporation, Android operating system available from Google, Blackberry operating system available from Blackberry Limited, a MAC OS operating system or an iOS operating system available from Apple, one of many Linux-based operating system distributions, for example, the Enterprise Linux operating system available from Red Hat Inc., a Solaris operating system available from Oracle Corporation, or UNIX operating systems available from various sources. Many other operating systems may be used, and examples are not limited to any particular operating system.

The processor 530 and operating system together define a computer platform for which application programs in high-level programming languages are written. These component applications may be executable, intermediate, bytecode or interpreted code which communicates over a communication network 520, for example, the Internet, using a communication protocol, for example, TCP/IP. Similarly, aspects may be implemented using an object-oriented programming language, such as .Net, Ruby, Objective-C, SmallTalk, Java, C++, Ada, C# (C-Sharp), Python, or JavaScript. Other object-oriented programming languages may also be used. Alternatively, functional, scripting, or logical programming languages may be used.

Also as shown in FIG. 5, in one example the distributed computer system 500 includes multiple computers 510 that are interconnected by, and may exchange data through, a communication network 520. The network 520 may include any communication network 520 through which computers 510 may exchange data. To exchange data using the network 520, the computers 510 and the network 520 may use various methods, protocols and standards, including, among others, Fibre Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST, and Web Services. To ensure data transfer is secure, the computers 510 may transmit data via the network 520 using a variety of security measures including, for example, SSL or VPN technologies. While the distributed computer system 500 illustrates three networked computers 510, the distributed computer system 500 is not so limited and may include any number of computers 510 and computing devices, which may be networked together using any medium and communication protocol.

Additionally, various aspects and functions may be implemented in a non-programmed environment. For example, documents created in HTML, XML or other formats, when viewed in an area of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements (e.g., specialized hardware, executable code, data structures or objects) that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters and thereby configure the behavior of the components.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A resolver converter comprising:
   a first input to receive a first signal, the first signal representing a sine component of a rotor angle;
   a second input to receive a second signal, the second signal representing a cosine component of the rotor angle;
   an output to provide an estimated rotor angle;
   at least one multiplier configured to multiply the first signal by the cosine of the estimated rotor angle to produce a first multiplied signal and to multiply the second signal by the sine of the estimated rotor angle to produce a second multiplied signal;
   a subtractor configured to calculate a difference between the first and second multiplied signals, the difference being an error measurement
   a toggle element configured to selectively reverse the sign of the error measurement by multiplying the error measurement by one of positive unity and negative unity; and
   a combiner configured to update the estimated rotor angle by combining the error measurement with the estimated rotor angle.

2. The resolver converter of claim 1 further comprising at least one analog to digital converter configured to convert the first and second signals from an analog form to a digital form.

3. The resolver converter of claim 1 further comprising at least one lookup table configured to provide the cosine of the estimated rotor angle and to provide the sine of the estimated rotor angle.

4. The resolver converter of claim 1 wherein the toggle element is configured to selectively reverse the sign of the error measurement based at least in part upon detection of a zero crossing in at least one of the first signal and the second signal.

5. The resolver converter of claim 1 wherein the error measurement is selectively multiplied by the one of positive unity and negative unity based upon a current binary state of the toggle element.

6. The resolver converter of claim 5 wherein the toggle element toggles between two binary states, the toggle event being triggered by detection of a zero crossing in at least one of the first signal and the second signal.

7. A method of converting resolver signals to an estimated rotor angle, the method comprising:
receiving a first signal from a resolver, the first signal representing a sine component of a rotor angle;
receiving a second signal from the resolver, the second signal representing a cosine component of the rotor angle;
multiplying the first signal by a cosine of the estimated rotor angle to provide a third signal;
multiplying the second signal by a sine of the estimated rotor angle to provide a fourth signal;
calculating an error measurement as a difference between the third and fourth signals;
selectively reversing the sign of the error measurement based at least in part upon detection of a zero crossing in at least one of the first signal and the second signal; and
modifying the estimated rotor angle by combining the error measurement with the estimated rotor angle.

8. The method of claim 7 further comprising converting the first and second signals from an analog form to a digital form.

9. The method of claim 7 further comprising selecting the cosine of the estimated rotor angle and the sine of the estimated rotor angle from a lookup table.

10. The method of claim 7 wherein selectively reversing the sign of the error measurement includes selectively multiplying the error measurement by one of positive unity and negative unity.

11. The method of claim 10 wherein the error measurement is selectively multiplied by the one of positive unity and negative unity based upon a current binary state of the toggle element.

12. The method of claim 11 further comprising toggling the toggle element between two binary states, the toggling triggered by detection of the zero crossing in at least one of the first signal and the second signal.

13. A non-transitory computer readable medium having stored instructions that, when executed by a processor coupled to a resolver, cause the processor to perform a method comprising:
receiving a first signal from the resolver, the first signal representing a sine component of a rotor angle;
receiving a second signal from the resolver, the second signal representing a cosine component of the rotor angle;
multiplying the first signal by a cosine of the estimated rotor angle to provide a third signal;
multiplying the second signal by a sine of the estimated rotor angle to provide a fourth signal;
calculating an error measurement as a difference between the third and fourth signals;
detecting a zero crossing in at least one of the first signal and the second signal;
selectively reversing the sign of the error measurement based at least in part upon detection of the zero crossing; and
modifying the estimated rotor angle by combining the error measurement with the estimated rotor angle.

14. The medium of claim 13 further comprising instructions for converting the first and second signals from an analog form to a digital form.

15. The medium of claim 13 further comprising instructions for selecting the cosine of the estimated rotor angle and the sine of the estimated rotor angle from a lookup table.

16. The medium of claim 13 wherein selectively reversing the sign of the error measurement includes multiplying the error measurement by one of positive unity and negative unity.

17. The medium of claim 16 wherein the error measurement is selectively multiplied by the one of positive unity and negative unity based upon the current binary state of the toggle element.

18. The medium of claim 17 further comprising instructions for toggling the toggle element between two binary states, the toggling triggered by the detection of the zero crossing in at least one of the first signal and the second signal.

19. A resolver converter comprising:
a first input to receive a first signal, the first signal representing a sine component of a rotor angle;
a second input to receive a second signal, the second signal representing a cosine component of the rotor angle;
an output to provide an estimated rotor angle;
at least one multiplier configured to multiply the first signal by the cosine of the estimated rotor angle to produce a first multiplied signal and to multiply the second signal by the sine of the estimated rotor angle to produce a second multiplied signal;
a subtractor configured to calculate a difference between the first and second multiplied signals, the difference being an error measurement
a toggle element configured to selectively reverse the sign of the error measurement, the toggle element configured to toggle between two binary states, the toggle event being triggered by detection of a zero crossing in at least one of the first signal and the second signal; and
a combiner configured to update the estimated rotor angle by combining the error measurement with the estimated rotor angle.

20. The resolver converter of claim 19 further comprising at least one analog to digital converter configured to convert the first and second signals from an analog form to a digital form.

21. The resolver converter of claim 19 further comprising at least one lookup table configured to provide the cosine of the estimated rotor angle and to provide the sine of the estimated rotor angle.

* * * * *